United States Patent
Shieh et al.

(10) Patent No.: US 7,208,331 B2
(45) Date of Patent: Apr. 24, 2007

(54) METHODS AND STRUCTURES FOR CRITICAL DIMENSION AND PROFILE MEASUREMENT

(75) Inventors: Jyu-Horng Shieh, Hsin-chu (TW); Wen-Chih Chiou, Miaoli (TW); Peng-Fu Hsu, Hsin-chu (TW); Baw-Ching Perng, Hsin-chu (TW); Hun-Jan Tao, Hsin chu (TW); Chia-Jen Chen, Chiayi (TW)

(73) Assignee: Taiwan Semiconductor Manufacturing Co., Ltd. (TW)

( * ) Notice: Subject to any disclaimer, the term of this patent is extended or adjusted under 35 U.S.C. 154(b) by 223 days.

(21) Appl. No.: 10/949,037

(22) Filed: Sep. 24, 2004

(65) Prior Publication Data

US 2006/0073620 A1    Apr. 6, 2006

(51) Int. Cl.
*H01L 21/66*   (2006.01)
*H01L 23/58*   (2006.01)

(52) U.S. Cl. .............................. 438/16; 438/14; 257/48; 257/E21.525

(58) Field of Classification Search .................. 438/14, 438/16, 18, 7, 17; 257/E21.206, 48, E21.525, 257/E21.521
See application file for complete search history.

(56) References Cited

U.S. PATENT DOCUMENTS

| | | | |
|---|---|---|---|
| 6,358,854 B1 * | 3/2002 | Fleming et al. ............. | 438/692 |
| 6,684,172 B1 * | 1/2004 | Subramanian et al. ...... | 702/105 |
| 6,771,356 B1 * | 8/2004 | Lyons et al. .................. | 356/32 |
| 6,773,939 B1 * | 8/2004 | Wright ......................... | 438/16 |
| 6,934,032 B1 * | 8/2005 | Subramanian et al. ...... | 356/445 |
| 6,967,349 B2 * | 11/2005 | Bonifield et al. ............. | 257/48 |
| 2004/0058460 A1 | 3/2004 | Bonifield et al. | |
| 2004/0119970 A1 | 6/2004 | Dusa et al. | |

FOREIGN PATENT DOCUMENTS

TW    90126146    1/2003

OTHER PUBLICATIONS

Abstract Translation of Taiwan 90126146 at http://www.tipo.gov.tw/eng/howto/prenshownet.asp?print=true&no=161885&q=&kw=kw. . . Jul. 7, 2004, 1 page.
Abstract Translation of Taiwan 90126146 at http://www.delphion.com/details?pn=TW00516147B_Jul. 7, 2004, 1 page.

* cited by examiner

*Primary Examiner*—Kevin M. Picardat
(74) *Attorney, Agent, or Firm*—Duane Morris LLP

(57) ABSTRACT

Methods and structures for critical dimension or profile measurement are disclosed. The method provides a substrate having periodic openings therein. Material layers are formed in the openings, substantially planarizing a surface of the substrate. A scattering method is applied to the substrate with the material layers for critical dimension (CD) or profile measurement.

6 Claims, 6 Drawing Sheets

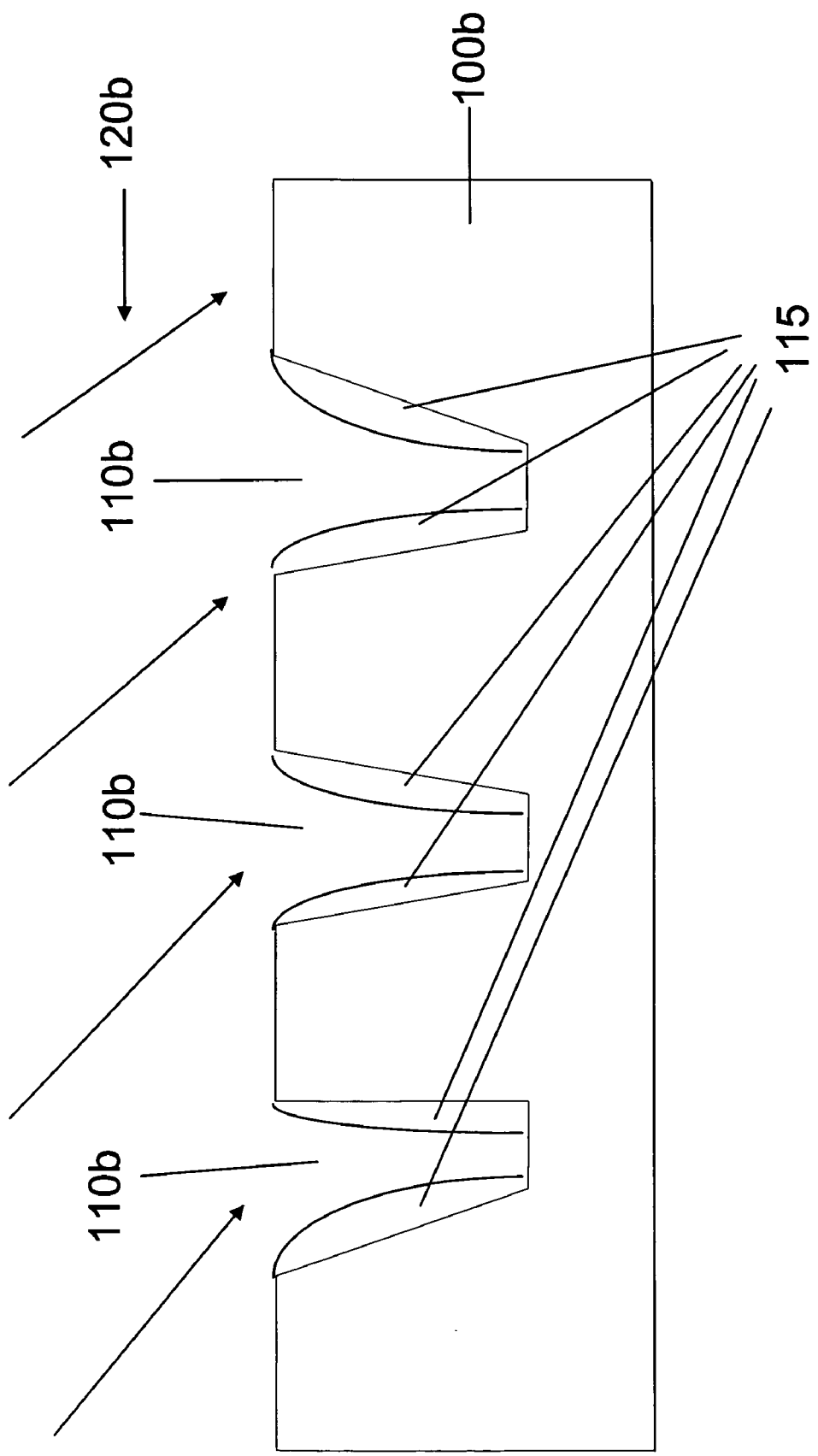

METHODS AND STRUCTURES FOR CRITICAL DIMENSION AND PROFILE MEASUREMENT

BACKGROUND OF THE INVENTION

1. Field of the Invention

The present invention relates to the fabrication of integrated circuit devices on semiconductor substrates and, more particularly relates to methods and structures for critical dimension (CD) or profile measurement.

2. Description of the Related Art

The Complementary Metal Oxide Semiconductor (CMOS) technology has been recognized as the leading technology for use in digital electronics in general and for use in many computer products in particular. The miniaturization of CMOS technology according to a scaling rule is used in a semiconductor device to achieve large-scale integration and high-speed operation. Due to minimization of integrated circuits, control of dimensions of devices becomes more important. In order to precisely control the dimensions of the devices, measurement for control dimension (CD) has been paid more attention during the process of manufacturing integrated circuits.

FIG. 1A shows a prior art method for measuring critical dimension of (CD) of a structure. The prior art method first provides a substrate 100a with periodic trenches 110a therein. A scatterometry optical critical dimension (OCD) method is used to measure the dimension of the trenches 110a. Light beams 120a arrive at the periodic trenches 110a and reflects so as to create a scattering spectrum. According to the scattering spectrum, the dimension of the trenches 110a can be measured.

FIG. 1B shows a prior art method for measuring critical dimension of (CD) of another structure. The prior art method also provides a substrate 100b with periodic trenches 110b therein. Spacers 115 are formed on the sidewalls of the trenches 110b. A scatterometry optical critical dimension (OCD) method is used to measure the dimension of the trenches 110b and the spacers 115. Light beams 120b arrive at the periodic trenches 110b and reflects so as to create a scattering spectrum. According to the scattering spectrum, the dimension of the trenches 110b and the spacers 115 can be measured.

These prior art methods described above use a non-planarized grating structure for Scatterometry OCD measurement.

U.S. Patent Application No. 2004/0058460 A1 discloses scatterometry test structures stacked over same footprint area. The prior art describes a plurality of scatterometry test structures for use in process control during fabrication of a semiconductor wafer having multilevel integrated circuit chips. Many of said levels have a feature size of a critical dimension. The scatterometry test structures on the wafer are at each level, suitable to measure critical dimensions. The second level and each subsequent level of the test structures are located to fit into the same footprint area as the first level. This prior art method also uses a non-planarized grating structure for Scatterometry OCD measurement. After Scatterometry OCD measurement, the periodic pattern is planarized with a dielectric layer.

Accordingly, methods and structures for CD or profile measurement are desired in this industry.

SUMMARY OF THE INVENTION

The present invention relates to a method for measuring critical dimension (CD) or profile of a structure. A substrate comprising periodic openings therein is provided. Material layers are formed in the openings, substantially planarizing a surface of the substrate. A scattering method is applied to the substrate with the material layers for CD or profile measurement.

The present invention also discloses a structure for critical dimension (CD) or profile of a structure. The structure comprises a substrate having periodic openings therein, and material layers formed in the openings substantially planarizing a surface of the substrate so as to measure dimensions of the structure by using a scattering method.

The present invention also discloses a structure for critical dimension (CD) or profile of a structure, which comprises a substrate having periodic trenches therein, and oxide layers formed in the trenches substantially planarizing a surface of the substrate so as to measure dimensions of the trenches by using a scatterometry optical critical dimension (OCD) method without a shielding layer formed over the trenches.

The above and other features of the present invention will be better understood from the following detailed description of the preferred embodiments of the invention that is provided in connection with the accompanying drawings.

BRIEF DESCRIPTION OF THE DRAWINGS

FIG. 1B shows a prior art method for measuring critical dimension of (CD) of another structure.

DESCRIPTION OF THE PREFERRED EMBODIMENTS

Figure 1A:
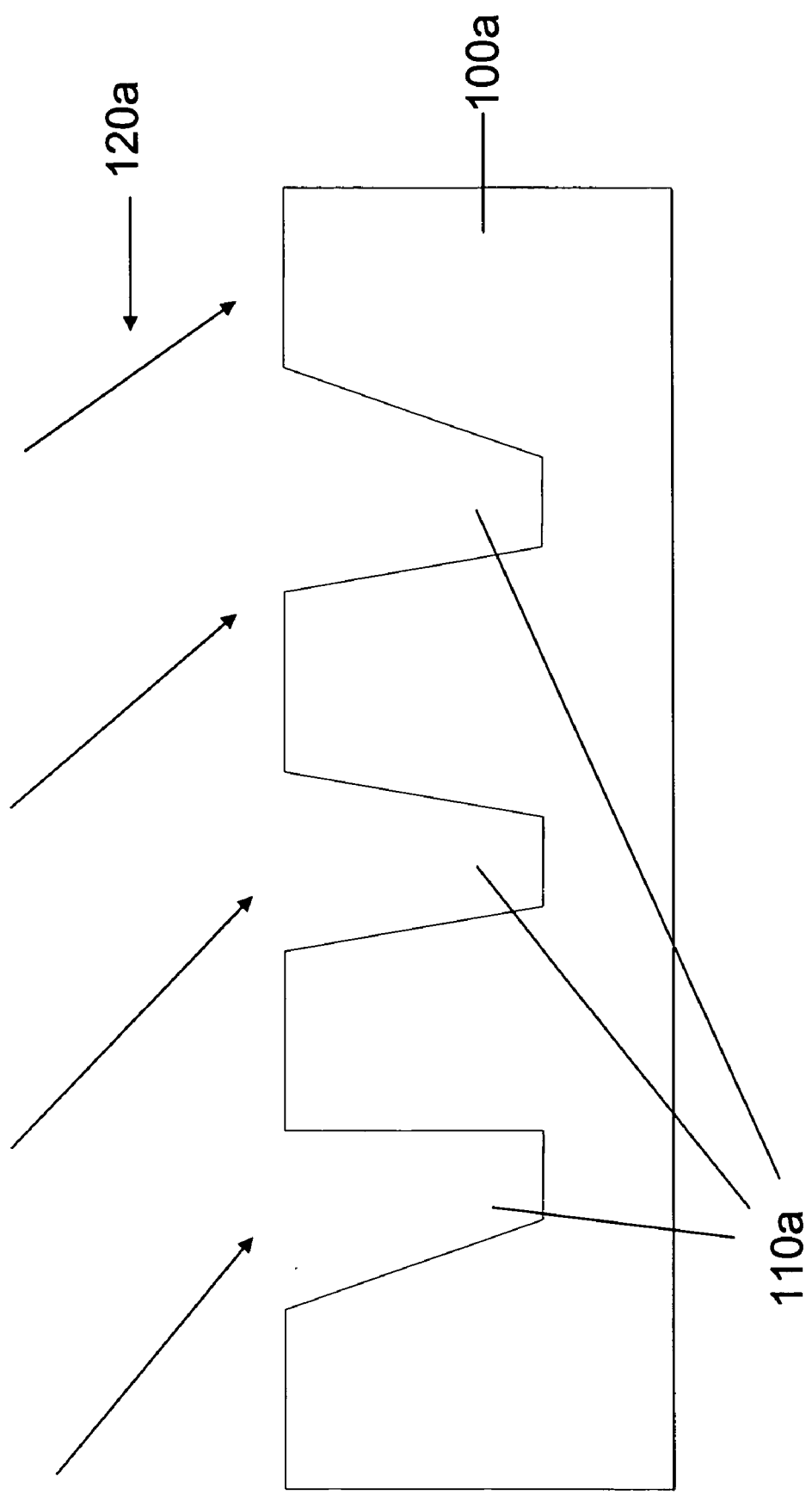
FIG. 1A shows a prior art method for measuring critical dimension of (CD) of a structure.
Figure 2A:
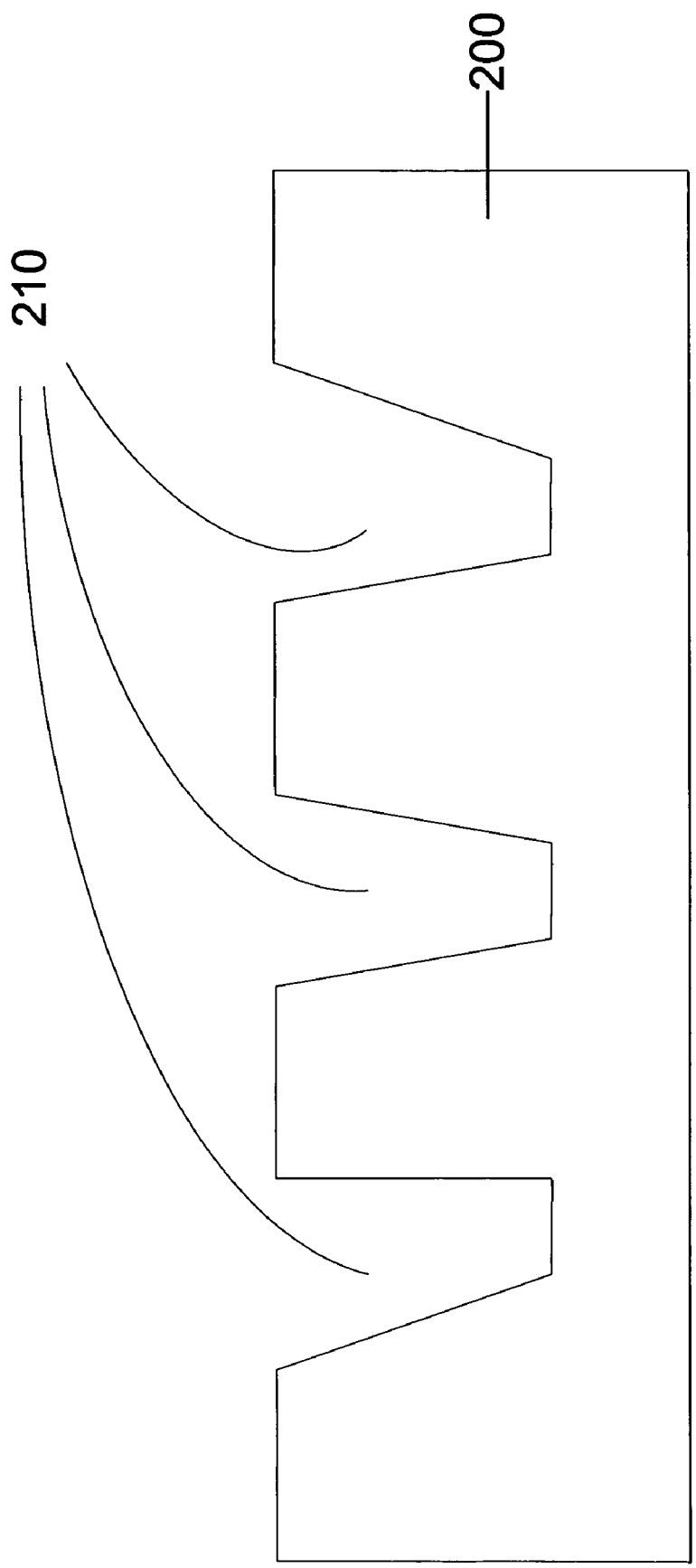
FIGS. 2A and 2B are a series of schematic cross sectional diagrams illustrating an exemplary method for forming a structure for measuring critical dimension (CD) and profile of the structure.
Figure 2B:
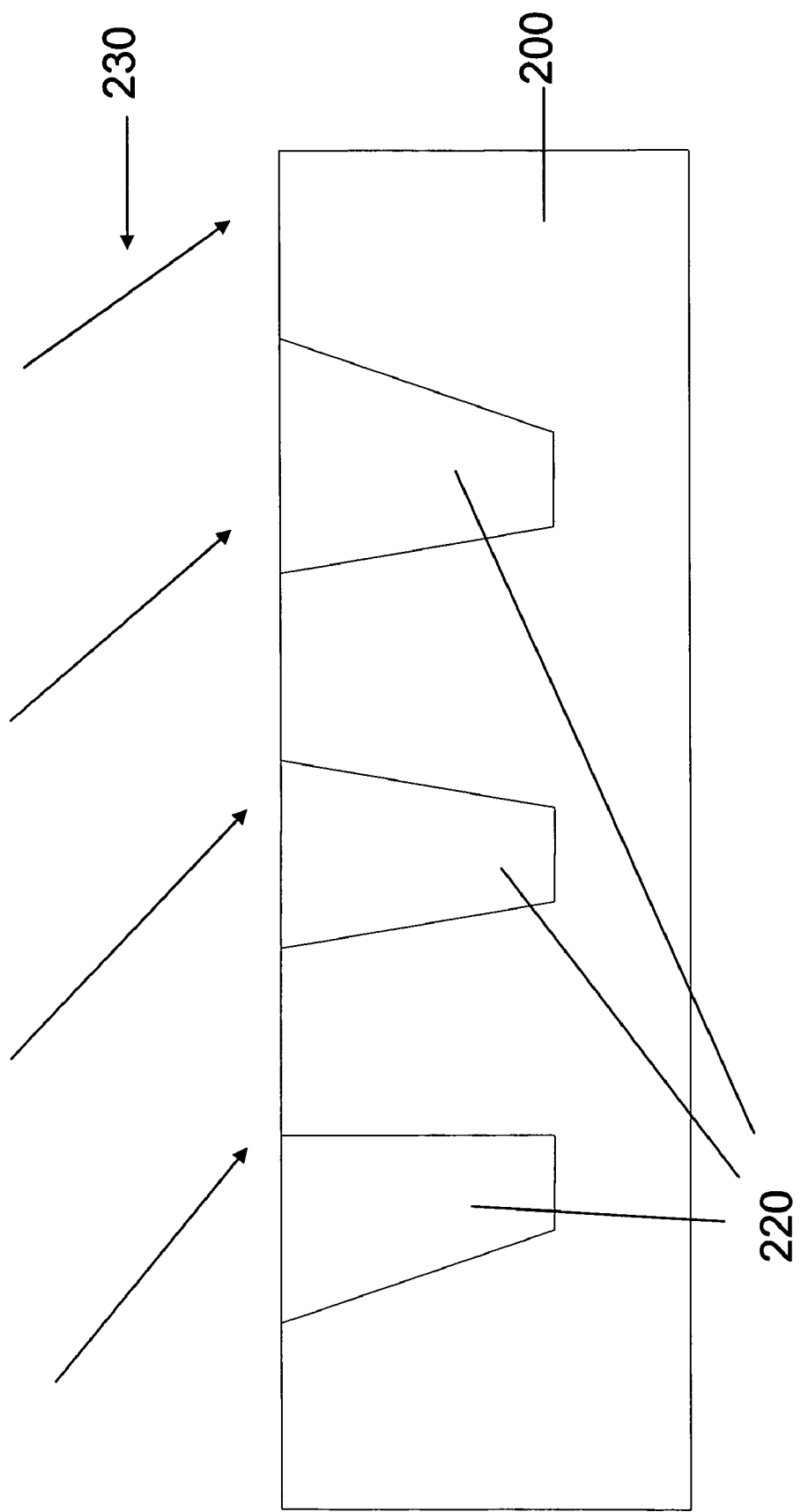

FIGS. 2A and 2B are a series of schematic cross sectional diagrams illustrating an exemplary method for forming a structure for measuring critical dimension (CD) and profile of the structure.

FIG. 2A shows that periodic openings 210 are formed in a substrate 200. The substrate 200 can be, for example, a silicon substrate, a III–V compound substrate, a glass substrate, a liquid crystal display (LCD) substrate or the other substrate similar to those described above. The openings 210 can be trenches, holes or any other periodic topographic structures. In this embodiment, the openings 210 are trenches which can be formed, for example, by a photolithographic process and an etch process. The depth of the openings 210 can be, for example, from about thousands of angstroms to about tens of thousands of angstroms.

Referring to FIG. 2B, material layers 220 are formed in the openings 210 shown in FIG. 2A and substantially planarize the surface 203 of the substrate 200. The material layers 220 can be a dielectric layer such as oxide, nitride or oxy-nitride. In this embodiment, the material layers 220 are oxide. The material layers 220 can be formed, for example, by forming a material (not shown) over the substrate 200, filling the openings 210. An etch-back process or chemical-mechanical polishing (CMP) process is used to remove the material above the surface 203 of the substrate 200.

A scattering method is used to measure the dimension and profile of the structure, such as the depth, the top width and the bottom width of the openings 210, the space between two neighboring openings 210, or the other dimension. The scattering method can be, for example, a scatterometry optical critical dimension (OCD) method. Light beams 230 are polarized and arrive at the periodic structure area. Due to scattering phenomenon, a scattering spectrum is generated which varies with the dimension and profile of the structure. According to the scattering spectrum, the dimension and profile of the structure are thus measured.

Figure 3A:
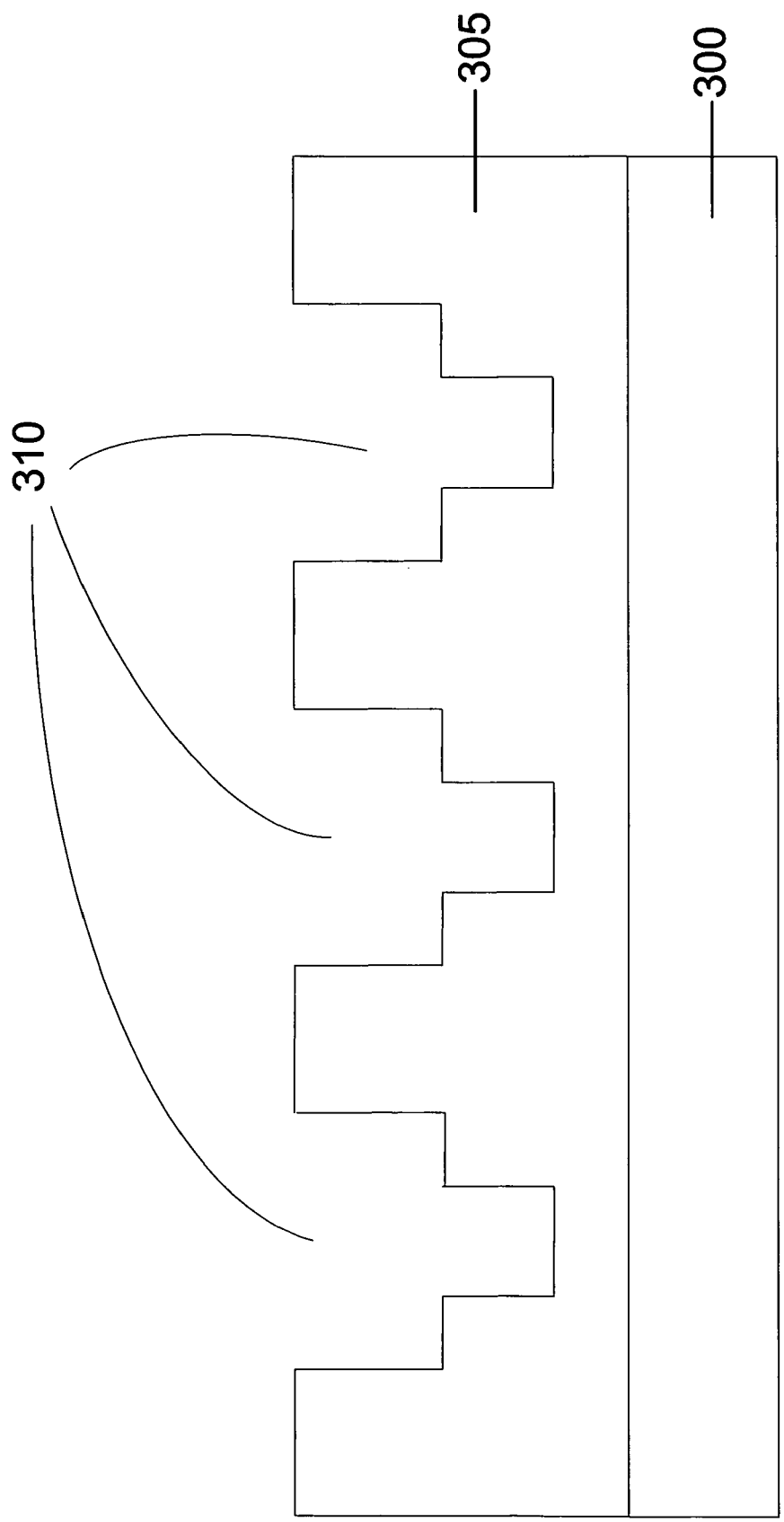
FIGS. 3A and 3B are a series of schematic cross sectional diagrams illustrating an exemplary method for forming another structure for measuring critical dimension (CD) and profile of the structure.
Figure 3B:
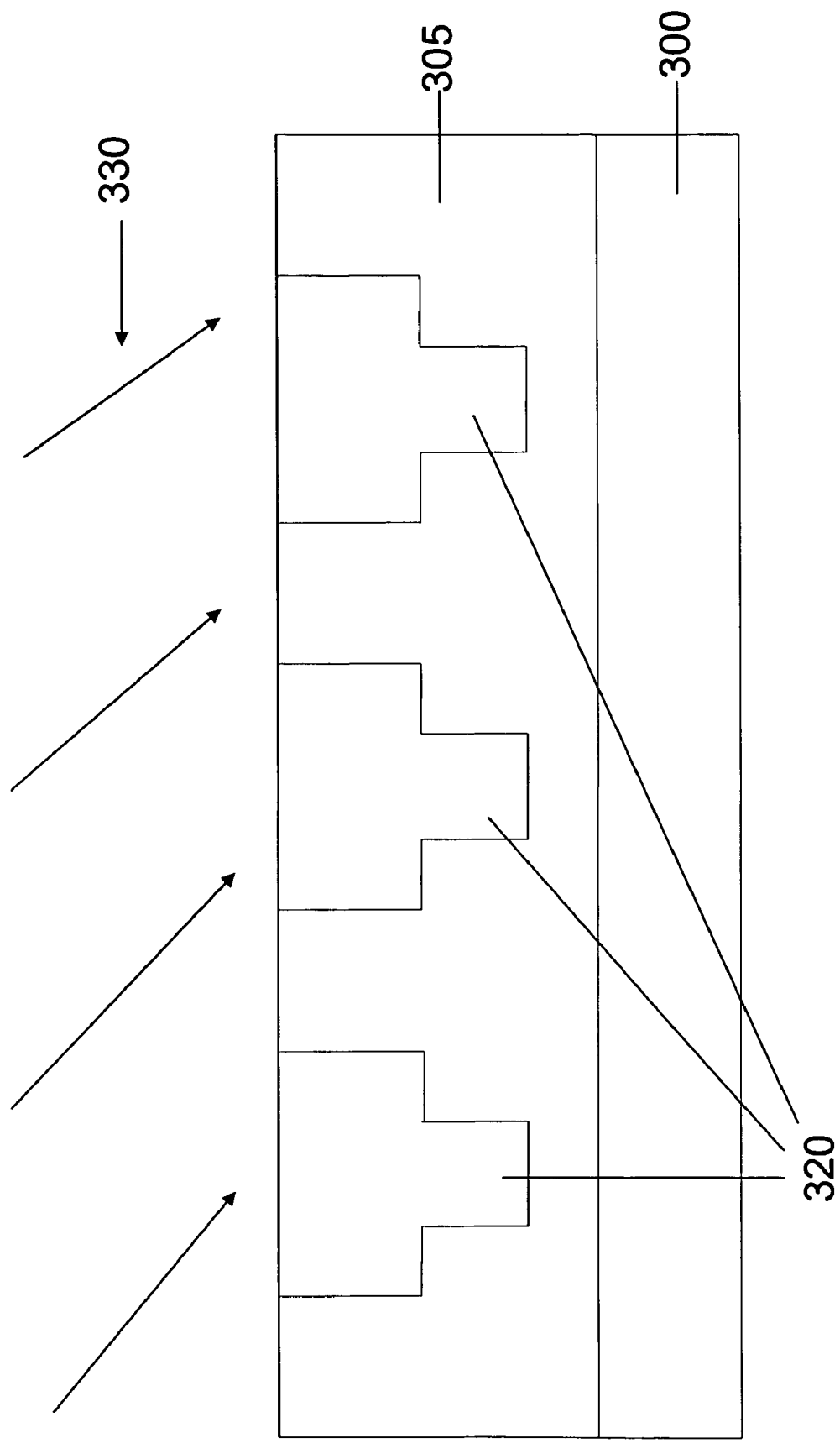

FIGS. 3A and 3B are a series of schematic cross sectional diagrams illustrating an exemplary method for forming another structure for measuring critical dimension (CD) and profile of the structure.

FIG. 3A shows that periodic openings 310 are formed in a dielectric layer 305 which is formed on a substrate 300. The substrate 300 is similar to the substrate 200 described in FIG. 2A. Detailed descriptions are not repeated. The dielectric layer 305 can be, for example, oxide, nitride, oxy-nitride or other dielectric material. The dielectric layer 305 can be formed, for example, by chemical vapor deposition (CVD). The openings 310 can be, for example, contact holes, via holes, dual damascene profile patterns, trenches or other periodic topographic structures. In this embodiment, the openings 310 are dual damascene profile patterns.

FIG. 3B shows that material layers 320 are formed in the openings 310 shown in FIG. 3A and substantially planarize the surface 303 of the substrate 300. The material layers 320 can be a metal layer such as copper, aluminum-copper or tungsten. In this embodiment, the material layers 320 are copper. The material layers 320 can be formed, for example, by forming a copper layer (not shown) over the substrate 300, filling the openings 310. A chemical-mechanical polishing (CMP) process is used to remove the copper layer above the surface 203 of the substrate 200.

A scattering method is used to measure the dimension and profile of the structure, such as the depth, the top width and the bottom width of the openings 310, the space between two neighboring openings 310, or the other dimension. In this embodiment, the scattering method is a scatterometry optical critical dimension (OCD) method. Light beams 330 are polarized and arrive at the periodic structure area. Due to scattering phenomenon, a scattering spectrum is generated which varies with the dimension and profile of the structure. According to the scattering spectrum, the dimension and profile of the structure are thus measured.

In these embodiments described above, no shielding layer is required to be formed over the material layers 210 and 310. In some embodiments with stacked test structure, a shielding layer might be required to be disposed between the upper and the lower test structures so as to curb the interference resulting from the reflection of the light beams from the lower test structure.

Although the present invention has been described in terms of exemplary embodiment, it is not limit thereto. Rather, the appended claims should be constructed broadly to include other variants and embodiments of the invention which may be made by those skilled in the field of this art without departing from the scope and range of equivalents of the invention.

What is claimed is:

1. A method for measuring critical dimension (CD) or profile of a structure, comprising:
   providing a substrate having periodic openings therein, material layers formed in the openings substantially planarizing a surface of the substrate, the substrate further comprising a dielectric layer thereon and the openings formed in the dielectric layer, wherein the material layers are formed in the openings by a dual damascene, contact or via process; and
   applying a scattering method to the substrate with the material layers, wherein no shielding layer is formed over the material layers.

2. The method of claim 1, wherein the scattering method comprises a scatterometry optical critical dimension (OCD) method.

3. A structure for critical dimension (CD) or profile of a structure, which comprises a substrate having periodic openings therein, and material layers formed in the openings substantially planarizing a surface of the substrate so as to measure dimensions of the structure by using a scattering method, the substrate comprising a dielectric layer on the substrate, the material layers formed in the dielectric layer, wherein the material layers are metal layers and no shielding layer is formed over the material layers.

4. The structure of claim 3, wherein the material layers are oxide.

5. The structure of claim 3, wherein the metal layers are copper, aluminum copper or tungsten.

6. The structure of claim 3, wherein the scattering method comprises a scatterometry optical critical dimension (OCD) method.

* * * * *